United States Patent
Chun et al.

(10) Patent No.: US 9,735,157 B1
(45) Date of Patent: Aug. 15, 2017

(54) SEMICONDUCTOR DEVICE AND METHOD OF FABRICATING THE SAME

(71) Applicant: SAMSUNG ELECTRONICS CO., LTD., Suwon-Si, Gyeonggi-Do (KR)

(72) Inventors: Kwan-Young Chun, Suwon-Si (KR); Yoon-Moon Park, Seoul (KR); Kang-Ill Seo, Chungcheongbuk-Do (KR); Wouns Yang, Suwon-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/073,908

(22) Filed: Mar. 18, 2016

(51) Int. Cl.
*H01L 27/088* (2006.01)
*H01L 23/528* (2006.01)
*H01L 27/02* (2006.01)

(52) U.S. Cl.
CPC ........ *H01L 27/0886* (2013.01); *H01L 23/528* (2013.01); *H01L 27/0207* (2013.01)

(58) Field of Classification Search
CPC .................. H01L 27/0886; H01L 27/0207
See application file for complete search history.

(56) References Cited

U.S. PATENT DOCUMENTS

| | | | |
|---|---|---|---|
| 6,495,870 B1 | 12/2002 | Sekiguchi et al. | |
| 6,566,019 B2 | 5/2003 | Kling et al. | |
| 6,779,167 B2 | 8/2004 | Igarashi et al. | |
| 6,787,823 B2 | 9/2004 | Shibutani | |
| 7,492,013 B2* | 2/2009 | Correale, Jr. | ....... H01L 27/0207 257/203 |
| 7,915,647 B2 | 3/2011 | Kato et al. | |
| 8,043,964 B2 | 10/2011 | Sandhu et al. | |
| 8,129,752 B2 | 3/2012 | Becker et al. | |
| 8,669,596 B2 | 3/2014 | Tamaru | |
| 2013/0181297 A1* | 7/2013 | Liaw | ...................... G11C 11/412 257/390 |
| 2016/0104678 A1* | 4/2016 | Jun | ........................ H01L 23/535 257/401 |

FOREIGN PATENT DOCUMENTS

JP 2011-176174 9/2011

* cited by examiner

*Primary Examiner* — Marc Armand
*Assistant Examiner* — Sarah Salerno
(74) *Attorney, Agent, or Firm* — F. Chau & Associates, LLC

(57) ABSTRACT

A semiconductor device includes a first active area, a second active area and a first gate line. The second active area is spaced apart from the first active area. The first gate line includes a first gate part crossing the first active area along a first imaginary line, a second gate part crossing the second active area along a second imaginary line, and a third gate part connecting the first gate part and the second gate part and extending along a third imaginary line crossing the first imaginary line and the second imaginary line. The first gate part, the second gate part and the third gate part are arranged so that the first gate line has a shape of 180° rotational symmetry. A point of the rotational symmetry is located on the first gate part.

19 Claims, 24 Drawing Sheets

1200

1400

SEMICONDUCTOR DEVICE AND METHOD OF FABRICATING THE SAME

TECHNICAL FIELD

The present inventive concept relates to a semiconductor device and a method of fabricating the same.

DESCRIPTION OF RELATED ART

A logic cell of a semiconductor device is an integrated structure of a semiconductor circuit for performing a specific function. The logic cell may be pre-designed in various ways in a standard cell. A semiconductor device may be formed using various standard cells.

Standard cells are subject to the constraints of design rules for efficient space utilization. As miniaturization and integration processes of semiconductor devices develop, critical dimensions of design rules are gradually being reduced. Accordingly, securing a margin of a ground rule, or securing a minimum distance between internal patterns is becoming an important challenge to prevent a short circuit between the patterns. The minimum distance may be secured when constraints such as dispersion uniformity of critical dimensions and line edge roughness (LER) of patterns are satisfied.

SUMMARY

According to an exemplary embodiment of the present inventive concept, a semiconductor device includes a first active area, a second active area and a first gate line. The second active area is spaced apart from the first active area. The first gate line includes a first gate part crossing the first active area along a first line, a second gate part crossing the second active area along a second line, and a third gate part connecting the first gate part and the second gate part and extending along a third line crossing the first line and the second line. The first gate part, the second gate part and the third gate part are arranged so that the first gate line has a shape of 180° rotational symmetry. A point of the rotational symmetry is located on the first gate part.

According to an exemplary embodiment of the present inventive concept, a semiconductor device is provided as follows. A first active area extends along a first direction. A second active area is spaced apart from the first active area. A middle area is disposed between the first and second active areas. A first gate line includes a first gate part crossing the first active area along a first imaginary line extending in a second direction intersecting the first direction, a second gate part crossing the second active area along a second imaginary line extending in the second direction, and a third gate part connecting the first gate part and the second gate part in the middle area. A second gate line crosses the first active area along the second imaginary line. A first end portion of the second gate is disposed in the middle area. A third gate line crosses the second active area along the first imaginary line. A second end portion of the third gate line is disposed in the middle area. The second gate line and the third gate line are spaced apart from the first gate line. The first end portion of the second gate line includes a first surface and a second surface in the middle area. The first surface faces the first gate part and the second surface is parallel to the first surface and opposite to the first surface. A length of the first surface in the second direction is smaller than a length of the second surface in the second direction.

According to an exemplary embodiment of the present inventive concept, a semiconductor device is provided as follows. A second active area is spaced apart from a first active area. A middle area disposed between the first and second active areas. A first gate line crosses the first active area along a first imaginary line. A first end portion of the first gate line is disposed in the middle area. A second gate line crosses the second active area along the first imaginary line. A second end portion of the second gate line is disposed in the middle area. A third gate line crosses the first active area along a second imaginary line. A third end portion of the third gate line is disposed in the middle area. A fourth gate line crosses the second active area along the second imaginary line. A fourth end portion of the fourth gate line is disposed in the middle area. A first contact part is disposed on the second gate line in the middle area. A second contact part is disposed on the third gate line in the middle area. A third contact part connects the first contact part and the second contact part. The first to fourth end portions have a shape of a right-angled trapezoid.

According to an exemplary embodiment of the present inventive concept, a method of fabricating a semiconductor device is provided as follows. A first active area and a second active area which is separated from the first active area are formed. A preliminary gate line is formed. The preliminary gate line includes first through fifth gate parts. The fifth gate part connects the first part and the second part, and the third part and fourth part. The preliminary gate line is partially etched such that the first gate part is separated from the second and fifth gate parts, that the fourth gate part is separated from the third and fifth gate parts. The first gate part crosses the first active area along a first imaginary line. The second gate part crosses the second active area along the first imaginary line. The third gate part crosses the first active area along a second imaginary line. The fourth gate part crosses the second active area along the second imaginary line. The fifth gate part is disposed in a middle area between the first and second active areas. End portions of the first and fourth gate parts which are disposed in the middle area and separated from the fifth gate part are shaped like a right-angled trapezoid.

According to an exemplary embodiment of the present inventive concept, a semiconductor device is provided as follows. A first active area extends in a first direction. A second active area extends in parallel to the first active area. A first gate line includes a first gate part, a second gate part and a third gate part, wherein the first gate part crosses the first active area, the second gate part crosses the second active area and third gate part connecting the first and second gate parts is disposed in a middle area between the first and second active areas. A second gate line crosses the first active area, having a first end portion disposed in the middle area. A third gate line crosses the second active area, including a second end portion disposed in the middle area. A first source/drain contact disposed on the first active area and between the first and second gate lines. A second source/drain contact disposed on the second active area and between the first and third gate lines. The first gate part and the second gate line are disposed on a first imaginary line. The second gate part and the third gate line are disposed on a second imaginary line. The first source/drain and the second source/drain are disposed on a third imaginary line. The third imaginary line is interposed between the first and second imaginary lines.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
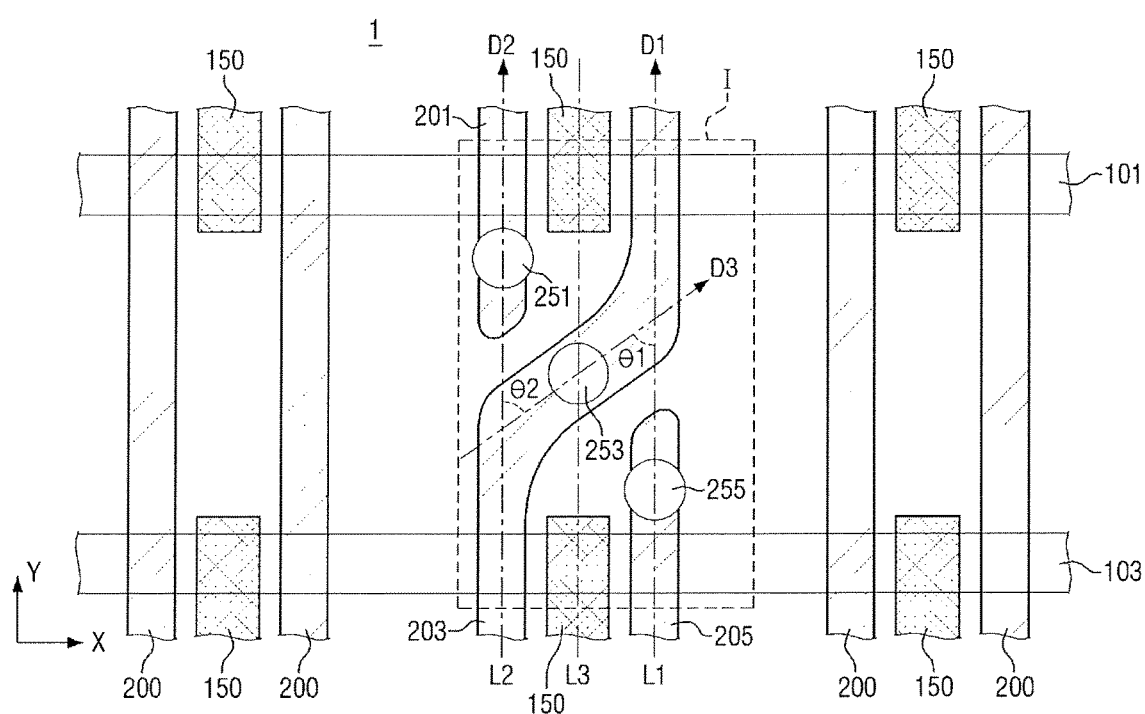
FIG. 1 is a layout view of a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Semiconductor devices and methods of fabricating the same according to exemplary embodiments of the present inventive concept will now be described with reference to FIGS. 1 through 16.

Figure 2:
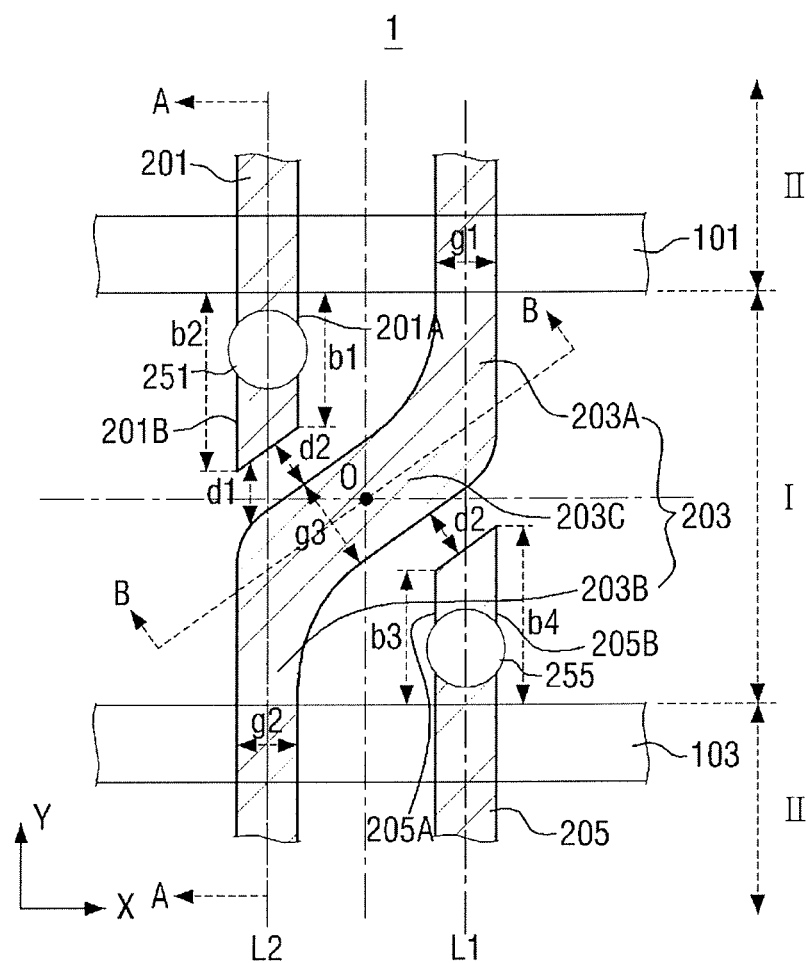
FIG. 2 is a layout view of a first area of FIG. 1 according to an exemplary embodiment of the present inventive concept.

FIG. 1 is a layout view of a semiconductor device 1 according to an exemplary embodiment of the present inventive concept. FIG. 2 is a layout of a first area I of FIG. 1 according to an exemplary embodiment of the present inventive concept.

Referring to FIGS. 1 and 2, the semiconductor device 1 includes a substrate 100, a plurality of active areas (101, 103), a plurality of gate lines 200, first through third gates 203, 201 and 205, gate contacts (251, 253, 255), and a plurality of source/drain contacts 150. Using the above elements, the semiconductor device 1 may operate as a planar transistor, a buried cell array transistor (BCAT), or a fin transistor.

For example, the substrate 100 may be, for example, a semiconductor substrate. The substrate 100 may contain silicon (Si), strained silicon, a silicon alloy, silicon carbide (SiC), silicon germanium (SiGe), silicon germanium carbide (SiGeC), germanium (Ge), a germanium alloy, gallium arsenide (GaAs), indium arsenide (InAs), a III-V semiconductor, a II-VI semiconductor, or any combination or stack thereof. The substrate 100 may also be an organic plastic substrate instead of the semiconductor substrate. A case where the substrate 100 is made of silicon will hereinafter be described as an example.

The substrate 100 may be of a P type or an N type. In some embodiments of the present inventive concept, the substrate 100 may be an insulating substrate. For example, the substrate 100 may be a silicon-on-insulator (SOI) substrate. When the SOI substrate is used, a signal delay time may be reduced in the operation of the semiconductor device 1.

The substrate 100 includes the active areas (101, 103). The active areas (101, 103) extend along an X-axis direction. The active areas (101, 103) are separated or spaced apart from each other along a Y-axis direction intersecting the X-axis direction. For example, the active areas (101, 103) include a first active area 101 and a second active area 103, and the second active area 103 is separated or spaced apart from the first active area 101. For example, the second active area 103 is disposed parallel to the first active area 101, but the present inventive concept is not limited thereto.

Each of the first and second active areas 101 and 103 may be part of the substrate 100 or an epitaxial layer grown from the substrate 100. The first and second active areas 101 and 103 may contain, for example, Si or SiGe. The first active area 101 and the second active area 103 may contain n- or p-type impurities. The first active area 101 includes a first fin F1 protruding upward from the substrate 100, and the second active area 103 includes a second fin F2 formed parallel to the first fin F1.

In some exemplary embodiments of the present inventive concept, the first and second fins F1 and F2 may be made of the same material as the substrate 100. For example, when the substrate 100 is made of silicon, the first and second fins F1 and F2 may also be made of silicon. However, the present inventive concept is not limited thereto. For example, the first and second fins F1 and F2 may be made of a different material from the substrate 100. In some exemplary embodiments of the present inventive concept, the first and second fins F1 and F2 may be formed by partially etching the substrate 100, but the present inventive concept is not limited thereto.

Although not specifically illustrated in the drawing, a cross-sectional shape of each of the first and second fins F1 and F2 may be a quadrilateral shape, a tapered shape (i.e., a shape which has downwardly increasing width from the top toward the bottom), or a chamfered shape (i.e., corners of each of the first and second fins F1 and F2 are rounded).

The gate lines 200 are formed on the first and second active areas 101 and 103. The gate lines 200 extend along the Y-axis direction to intersect the first and second active areas 101 and 103. The gate lines 200 are separated or spaced apart from each other in the X-axis direction. The gate lines 200 may be separated at regular intervals. The gate lines 200 may contain a metal having high conductivity. However, the present inventive concept is not limited thereto. For example, in some other embodiments of the present inventive concept, the gate lines 200 may be made of a non-metal such as polysilicon.

The first through third gates 203, 201 and 205 are located between the gate lines 200. Hereinafter, a gate may be interchangeably used with a gate line. For example, the first gate 203 may be referred to as a first gate line 203. While the gate lines 200 extend straight, the first gate 203 is bent one or more times between the first active area 101 and the second active area 103. The substrate 100 may be divided into the first area I between the first active area 101 and the second active area 103 and a second area II excluding the first area I. The first area I will hereinafter be described as a middle area I.

The first gate 203 includes first through third gate parts 203A through 203C.

The first gate 203 in the middle area I may include a diagonal shape. For example, the first gate part 203A overlaps or crosses the first active area 101. The first gate part 203A does not overlap the second active area 103. The first gate part 203A extends along a first direction D1. The second gate part 203B overlaps or crosses the second active area 103. The second gate part 203B does not overlap the first active area 101. The second gate part 203B extends along a second direction D2. The third gate part 203C electrically connects the first gate part 203A and the second gate part 203B, extending along a third direction D3 different from the first direction D1 and the second direction D2. The first through third gate parts 203A through 203C may lie in the same plane for a planar transistor. Alternatively, for a three-dimensional transistor, the active area (101, 103) may have a fin-type structure, and thus the first through third gate parts 203A through 203C may lie in different planes.

The third direction D3 intersects the first direction D1 at a first acute angle Θ1 with respect to the first direction D1. The third direction D3 intersects the second direction D2 at a second acute angle Θ2 with respect to the second direction D2.

The first through third gates 203, 201 and 205 are spaced apart from each other. The second gate 201 crosses the first active area 101 along the second direction D2, and its end portion is disposed in a region between two adjacent active regions 101 and 102. The third gate 205 crosses the second active area 103, and its end portion is disposed in a region between two adjacent active regions 101 and 102. The third gate 205 and the first gate part 203A extend in parallel and spaced apart from each other. Likewise, the second gate 201 and the second gate part 203B extend in parallel and spaced apart from each other.

For example, the third gate 205 and the first gate part 203A are disposed on a first line L1 extending along the first direction D1, and the second gate 201 and the second gate part 203B are disposed on a second line L2 extending along the second direction D2. The first line L1 and the second line L2 are imaginary lines for the convenience of description, and the two line L1 and L2 are spaced apart from each other. The first line L1 and the second line L2 are, but are not limited to, parallel to each other.

The third direction D3 crosses the first line L1 and the second line L2 in a diagonal direction.

The second gate 201 has a shape of a right-angled trapezoid in a region between the first and second active regions 101 and 102. The right-angled trapezoid refers to a trapezoid having one or more right angles formed by sides thereof. A side of the right-angled trapezoid which does not form a right angle extends in the third direction D3 which is the diagonal direction. The end portion of the second gate 201, disposed in the region between the first and second active regions in the first area I, has a surface extending in the third direction D3 and facing the third gate part 203C of the first gate 203. The third direction D3 is the diagonal direction.

Likewise, a portion of the third gate 205 which overlaps the middle area I may be shaped like a right-angled trapezoid. A surface of an end of the third gate 205 which overlaps the middle area I may also extend in the third direction D3 and face the third gate part 203C of the first gate 203. The second gate 201 and the third gate 205 may be disposed symmetrically to each other with respect to a center of the third gate part 203C, but the present inventive concept is not limited thereto.

The gate contacts (251, 253, 255) may be formed on the first through third gates 203, 201 and 205. The gate contacts (251, 253, 255) may be formed in the middle area I between the first and second active areas 101 and 103. In FIG. 1, the gate contacts (251, 253, 255) are circular, but the shape of each of the gate contacts (251, 253, 255) is not limited to the circular shape. The shape and size of each of the gate contacts (251, 253, 255) are not limited to a particular shape and size as long as the gate contacts (251, 253, 255) can overlap the gate lines (203, 201, 205). For example, a diameter of each of the gate contacts (251, 253, 255) may be greater than a width of each of the gate lines (203, 201, 205). Alternatively, the diameter of each of the gate contacts (251, 253, 255) may be smaller than the width of each of the gate lines (203, 201, 205), but each of the gate contacts (251, 253, 255) may have a portion not overlapping a corresponding one of the gate lines (203, 201, 205).

The gate contacts (251, 253, 255) may contain a conductive material. For example, the gate contacts (251, 253, 255) may contain at least one of metal and polysilicon. In addition, each of the gate contacts (251, 253, 255) may have a tapered cross-sectional shape, for example, may become wider from the top toward the bottom. However, the cross-sectional shape of each of the gate contact (251, 253, 255) is not limited to the tapered shape. In some embodiments of the present inventive concept, the cross-sectional shape of each of the gate contacts (251, 253, 255) may be a quadrilateral shape. In some other embodiments of the present inventive concept, the cross-sectional shape of each of the gate contacts (251, 253, 255) may be a chamfered shape. For example, corners of each of the gate contacts (251, 253, 255) may be rounded.

The gate contacts (251, 253, 255) may include first through third contacts 251, 255 and 253. The first through third contacts 251, 255 and 253 may be formed between the first active area 101 and the second active area 103. The first contact 251 may be formed on the second gate 201. The second contact 255 may be formed on the third gate 205. The third contact 253 may be formed on the first gate 203. The first through third contacts 251, 255 and 253 may extend along a Z-axis direction.

The gate contacts (251, 253, 255) are electrically connected to the first through third gates 203, 201 and 205 and selectively connected to the first through third gates 203, 201 and 205 by a wiring structure which includes a metal and a via. Therefore, the semiconductor device 1 according to the first embodiment can function as one logic cell.

The source/drain contacts 150 may be formed on the first active area 101 or the second active area 103. The source/drain contacts 150 may be electrically connected to the first active area 101 or the second active area 103. The source/drain contacts 150 may be disposed between the gate lines 200. In addition, one source/drain contact 150 may be disposed between the first gate 203 and the second gate 201 and between the first gate 203 and the third gate 205.

Like the gate contacts (251, 253, 255), the source/drain contacts 150 may contain a conductive material. For example, the source/drain contacts 150 may contain at least one of metal and polysilicon. In addition, each of the source/drain contacts 150 may have a tapered cross-sectional shape, For example, may become wider from the top toward the bottom. However, the cross-sectional shape of each of the source/drain contacts 150 is not limited to the tapered shape. For ease of description, a description of the source/drain contacts 150 will be omitted.

Figure 3:
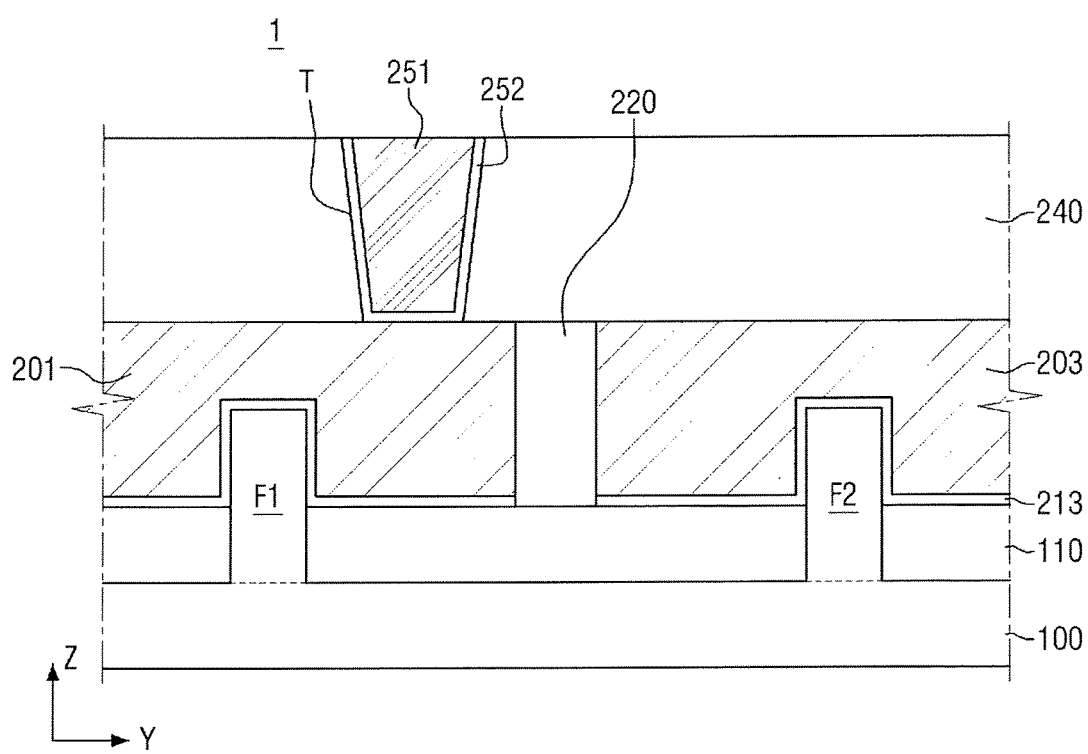
FIG. 3 is a cross-sectional view taken along line A-A of FIG. 3.
Figure 4:
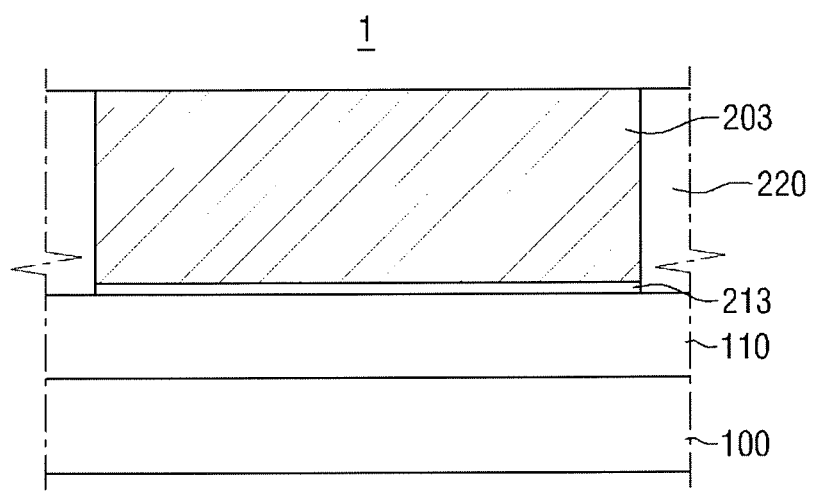
FIG. 4 is a cross-sectional view taken along line B-B of FIG. 3.

FIG. 3 is a cross-sectional view taken along line A-A of FIG. 2, and FIG. 4 is a cross-sectional view taken along line B-B of FIG. 2.

Referring to FIGS. 2 and 3, the first and second fins F1 and F2 protruding upward from the substrate 100 are disposed in the first active area 101 and the second active area 103 on the substrate 100. A device isolation layer 110 is formed on the substrate 100 between the first active area 101 and the second active area 103.

The device isolation layer 110 may be formed on side surfaces of the first and second fins F1 and F2 and on an upper surface of the substrate 100. The device isolation layer 110 may have, but is not limited to, a shallow trench isolation (STI) structure. The STI structure may have device isolation characteristics for high-density integration, occupying a small area. The device isolation layer 110 may contain at least one of silicon oxide, silicon nitride, silicon oxynitride, and any a combination thereof.

A gate insulating layer 213 is conformally formed on the first active area 101, the second active area 103 and the device isolation layer 110. The gate insulating layer 213 may contain a high-k material having a higher dielectric constant than a silicon oxide layer. For example, the gate insulating layer 213 may contain at least one of $HfO_2$, $ZrO_2$, $Ta_2O_5$, $TiO_2$, $SrTiO_3$, and $(Ba, Sr)TiO_3$. The gate insulating layer 213 may be formed to an appropriate thickness according to the type of device to be formed.

The first through third gates 203, 201 and 205 are formed on the gate insulating layer 213.

A space between the first through third gates 203, 201 and 205 are filled with a first interlayer insulating film 220. The first interlayer insulating film 220 may serve to electrically insulate the first through third gates 203, 201 and 205 from each other. The first interlayer insulating film 220 may be made of silicon oxide such as borosilicate glass (BSG), phosphosilicate glass (PSG), borophosphosilicate glass (BPSG), undoped silicate glass (USG), tetraethylorthosilicate glass (TEOS), or high density plasma-chemical vapor deposition (HDP-CVD). Upper surfaces of the first through third gates 203, 201 and 205 and an upper surface of the first interlayer insulating film 220 may lie in the same plane.

A second interlayer insulating film 240 is formed on the first interlayer insulating film 220. The second interlayer insulating film 240 may be substantially the same as the first interlayer insulating film 220.

A trench T is formed in the second interlayer insulating film 240. A barrier metal 252 is conformally formed on an inner surface of the trench T. For example, the barrier metal 252 may be formed to a predetermined thickness on both side surfaces and a lower surface of the trench T. Alternatively, the barrier metal 252 may be formed to a predetermined thickness only on the lower surface of the trench. The barrier metal 252 may contain titanium (Ti), titanium nitride (TiN), or tungsten nitride (WN). The barrier metal 252 may be formed by, but is not limited to, physical vapor deposition (PVD), chemical vapor deposition (CVD) or interlayer dielectric (ILD) deposition.

The gate contact 251 is formed on the barrier metal 252. Other gate contacts 253 and 255 may be formed on respective barrier metals. The upper surfaces of the gate contacts (251, 253, 255) lie in the same plane with an upper surface of the second interlayer insulating film 240.

The gate contacts (251, 253, 255) include the first contact 251 and the second contact 255. The first contact 251 is formed on the second gate 201 to be spaced apart from the first active area 101. The second contact 255 is formed on the third gate 205 to be spaced apart from the second active area 103. The first contact 251 and the second contact 255 are disposed symmetrically to each other with respect to the center O of the third gate part 203C.

The shape and size of each of the first and second contacts 251 and 255 are not limited to a particular shape and size as long as the first and second contacts 251 and 255 do not overlap the first gate 203. Each of the first and second contacts 251 and 255 may contain at least one of metal and polysilicon. In addition, each of the first and second contacts 251 and 255 may have a tapered shape. However, the shape of each of the first and second contacts 251 and 255 is not limited to the tapered shape and may also be a quadrilateral shape.

As described above, a semiconductor device 1 according to an exemplary embodiment may prevent a short circuit forming the first through third gates 203, 201 and 205 in a confined space. Therefore, the reliability of the semiconductor device 1 may be increased.

Figure 5:
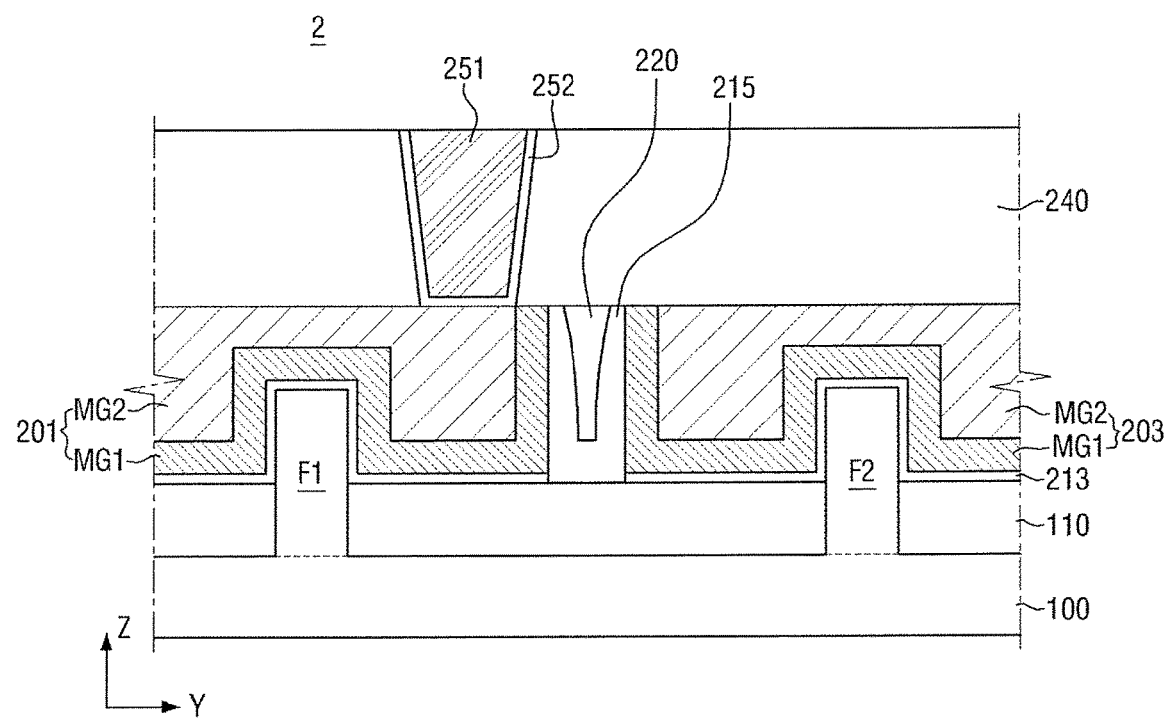
FIG. 5 is a cross-sectional view of a semiconductor device according to an exemplary embodiment of the present inventive concept.

FIG. 5 is a cross-sectional view of a semiconductor device according to an exemplary embodiment of the present inventive concept.

Referring to FIG. 5, the semiconductor device 2 is substantially the same as the semiconductor device 1 described above with reference to FIGS. 2 through 4. For simplicity, a description of elements substantially identical to those of the previous embodiment will be omitted, and the current embodiment will hereinafter be described, focusing mainly on differences with the pervious embodiment.

Each of first through third gates 203, 201 and 205 of the semiconductor device 2 may include metal layers (MG1, MG2). As illustrated in the drawing, each of the first through third gates 203, 201 and 205 includes two or more metal layers (MG1, MG2) stacked on each other. A first metal layer MG1 may serve to control a work function, and a second metal layer MG2 may fill a space formed by the first metal layer MG1. For example, the first metal layer MG1 may contain at least one of TiN, TaN, TiC, and TaC. In addition, the second metal layer MG2 may contain W or Al. Alternatively, each of the first through third gates 203, 201 and 205 may be made of a material (e.g., Si or SiGe) other than a metal. The first through third gates 203, 201 and 205 may be formed by, but are not limited to, a replacement gate process.

A gate insulating layer 213 is formed between first and second fins F1 and F2 and the first through third gates 203, 201 and 205. The gate insulating layer 213 is formed on top and side surfaces of the first and second fins F1 and F2. In addition, the gate insulating layer 213 is disposed between the first through third gates 203, 201 and 205 and a device isolation layer 110. The gate insulating layer 213 may contain a high-k material having a higher dielectric constant than a silicon oxide layer. For example, the gate insulating layer 213 may contain $HfO_2$, $ZrO_2$, or $Ta_2O_5$.

The semiconductor device 2 further includes a spacer 215. The spacer 215 is formed on at least one side of each of the first through third gates 203, 201 and 205. The spacer 215 may include at least one of a nitride layer and an oxynitride layer. In FIG. 5, a side surface of the spacer 215 is curved, but the shape of the side surface of the spacer 215 is not limited to the curved shape. The shape of the spacer 215 may have any shape. For example, the spacer 215 may have an 'I' shape or an 'L' shape.

Although not specifically illustrated in the drawing, elevated source or drain regions (not illustrated) may be formed on both sides of each of the first through third gates 203, 201 and 205 and on each of the first fin F1 and the second fin F2. The elevated source or drain regions (not illustrated) may be in contact with side surfaces of the spacer 215 and the first and second fins F1 and F2.

Each of the elevated source or drain regions (not illustrated) may have various shapes. For example, each of the elevated source or drain regions (not illustrated) may have at least one of a diamond shape, a circular shape, and a rectangular shape.

Figure 6:
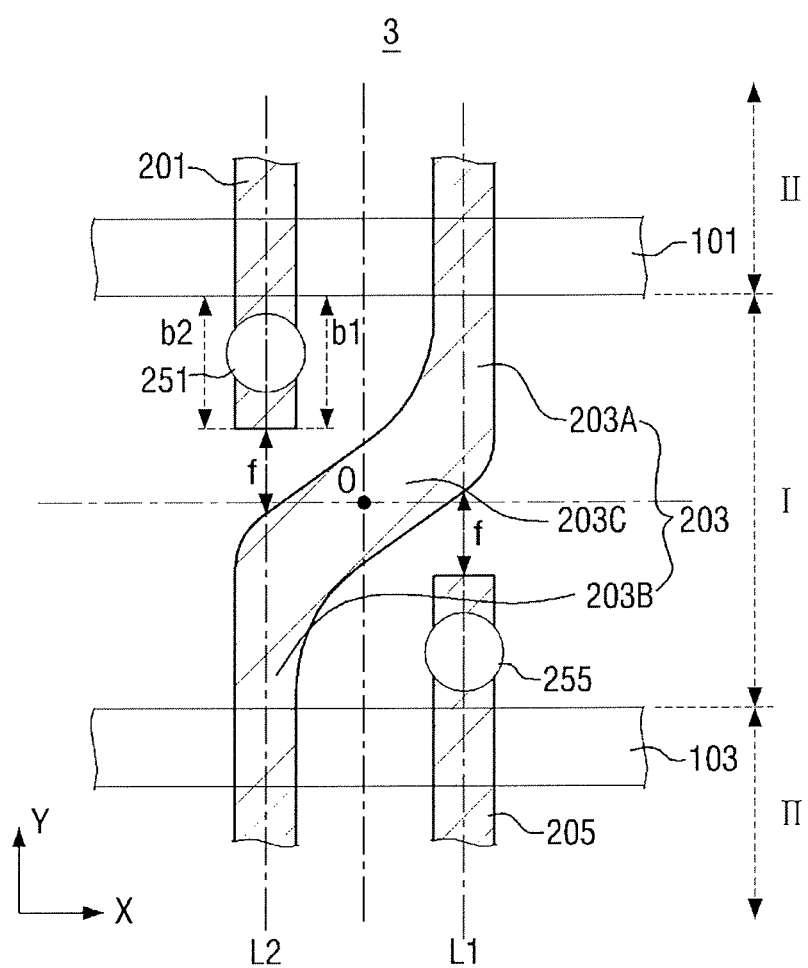
FIG. 6 is a layout view of a semiconductor device according to an exemplary embodiment of the present inventive concept.

FIG. 6 is a layout view of a semiconductor device according to an exemplary embodiment of the present inventive concept. For simplicity, a description of elements substantially identical to those of the previous embodiments will be omitted, and the current embodiment will hereinafter be described, focusing mainly on differences with the pervious embodiments.

Referring to FIG. 6, a first gate 203 of the semiconductor device 3 is substantially the same as the first gate 203 of the semiconductor device 1 described above with reference to FIGS. 2 through 4. However, the semiconductor device 3 is different from the semiconductor device 1 in the shapes of a second gate 201 and a third gate 205.

A substrate 100 includes a middle area I between a first active area 101 and a second active area 103. The first gate 203 includes first through third gate parts 203A through 203C.

The first gate part 203A is formed along a first line L1 extending along a Y-axis direction, overlapping the first active area 101. The second gate part 203B extends along the Y-axis direction. The second gate part 203B is formed along a second line L2 spaced apart from the first line L1, overlapping the second active area 103. The third gate part 203C electrically connects the first gate part 203A and the second gate part 203B in the middle area I. The third gate part 203C extends in a diagonal direction that intersects both the first line L1 and the second line L2. The diagonal direction forms an acute angle with each of the first line L1 and the second line L2.

The second gate 201 is formed along the second line L2, overlapping the first active area 101. The second gate 201 is spaced apart from the second active area 103. The third gate 205 is formed along the first line L1, overlapping the second active area 103. The third gate 205 is spaced apart from the first active area 101. For example, the second gate 201 and the second gate part 203B are disposed on the same line L2. The second gate 201 and the second gate part 203B are spaced apart from each other. The third gate 205 and the first gate part 203A are disposed on the same line L1. The third gate 205 and the first gate part 203A are spaced apart from each other.

A portion of the second gate 201 includes a first surface and a second surface in the middle area I. The first and second surfaces are in parallel to each other. The first surface faces the first gate part 203A. A length b1 of the first surface in the Y-axis direction is equal to a length b2 of the second surface in the Y-axis direction. The portion of the second gate 201 which overlaps the middle area I has a rectangular shape.

A distance f between the second gate 201 and the first gate 203 measured along the second line L2 in the Y-axis direction may be, but is not limited to, greater than the distance dl between the second gate 201 and the first gate 201 of the semiconductor device 1 of FIG. 2.

The third gate 205 may be formed symmetrically to the second gate 201 with respect to a center O of the third gate part 203C.

Figure 7:
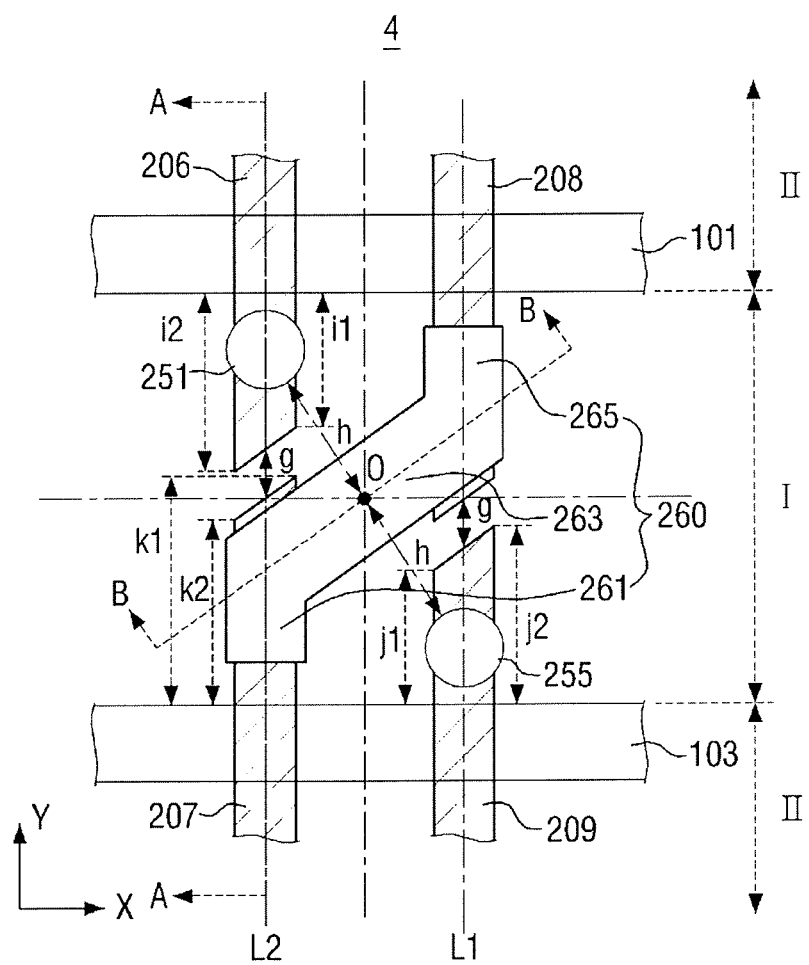
FIG. 7 is a layout view of a semiconductor device according to an exemplary embodiment of the present inventive concept.
Figure 8:
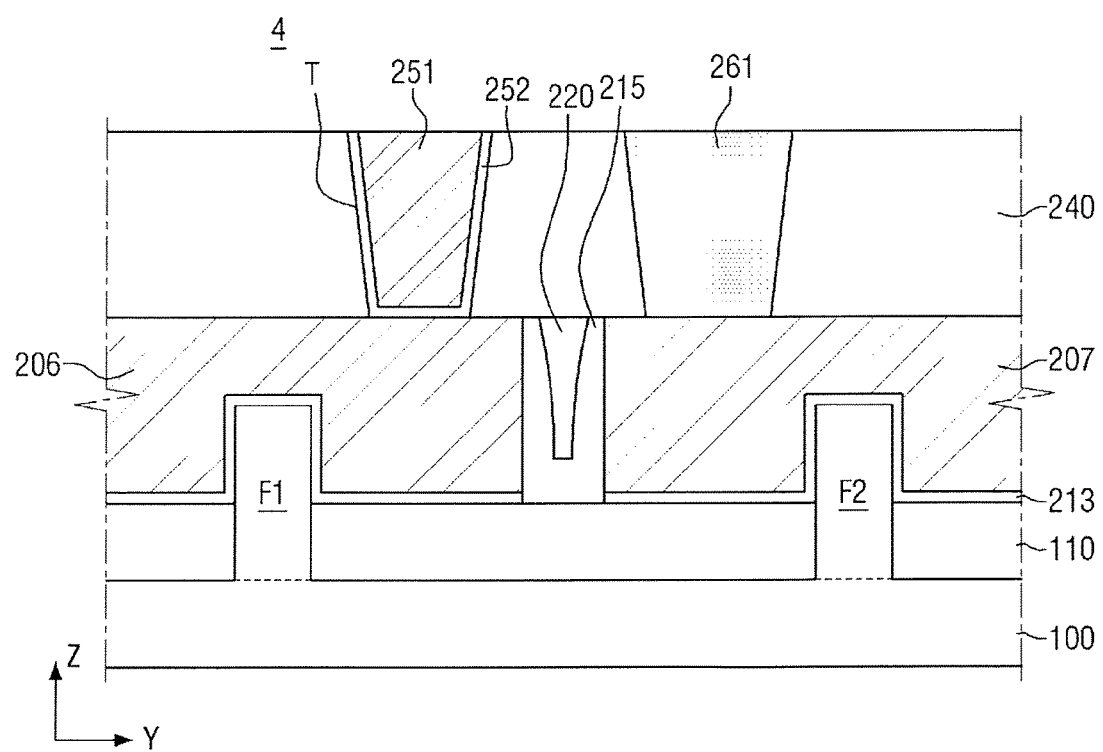
FIG. 8 is a cross-sectional view taken along line A-A of FIG. 8.
Figure 9:
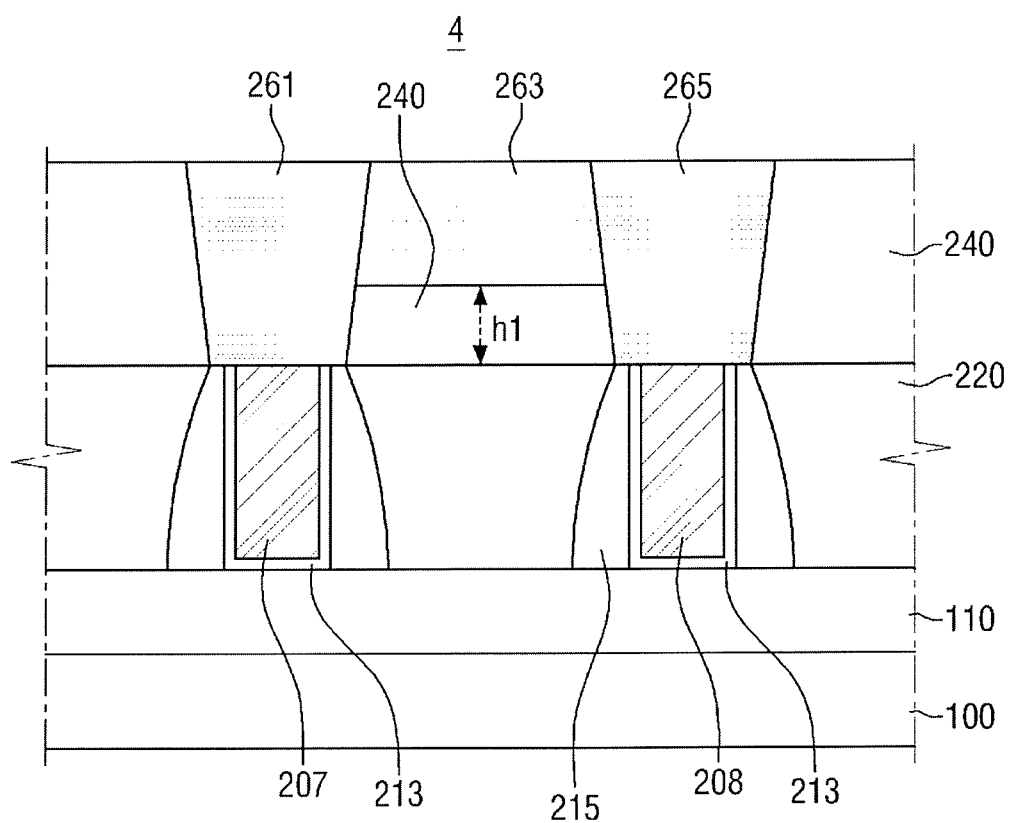
FIG. 9 is a cross-sectional view taken along line B-B of FIG. 8.

FIG. 7 is a layout view of a semiconductor device according to an exemplary embodiment of the present inventive concept. FIG. 8 is a cross-sectional view taken along line A-A of FIG. 7. FIG. 9 is a cross-sectional view taken along line B-B of FIG. 7.

Referring to FIG. 7, the semiconductor device 4 includes a substrate 100, first and second active areas 101 and 103, first through fourth gates 206 through 209, and gate contacts (251, 255, 260). The gate contacts (251, 255, 260) include first through third contacts 251, 260 and 255. Using these elements, the semiconductor device 4 operate as a planar transistor, a BCAT, or a fin transistor.

The substrate 100 includes the first active area 101, the second active area 103, and a middle area I between the first active area 101 and the second active area 103.

The first gate 206, extending along a first direction, overlaps the first active area 101. The first gate 206 is spaced apart from the second active area 103. The second gate 207, extending along the first direction, overlaps the second active area 103. The second gate 207 is spaced apart from the first gate 206. The third gate 208, extending along a second direction, overlaps the first active area 101. The third gate 208 is spaced apart from the first gate 206 and the second active area 103. The fourth gate 209, extending along the second direction, overlapping the second active area 103. The fourth gate 209 is spaced apart from the third gate 208. The third gate 208 and the fourth gate 209 are disposed on a first line L1, and the first gate 206 and the second gate 207 are disposed on a second line L2 spaced apart from the first line L1. The first line L1 and the second line L2 may be, but are not limited to, parallel to each other.

Each of the first through fourth gates 206 through 209 may contain, but not limited to, polysilicon. Each of the first through fourth gates 206 through 209 may include a first metal layer MG1 and a second metal layer MG2 which contain different metal materials.

Each of the first through fourth gates 206 through 209 is shaped like a right-angled trapezoid in the middle area I. For example, a portion of the first gate 206 includes a first surface and a second surface in the middle area I. The first surface faces the third gate 208 and a second surface which is parallel to the first surface. A length i1 of the first surface in the first direction is smaller than a length i2 of the second surface in the first direction. For example, a surface of an end of the first gate 206 which faces the second gate 207 extends in a third direction that crosses the first direction and the second direction.

On the other hand, a portion of the second gate 207 located in the middle area I may include a first surface which faces the fourth gate 209 and a second surface which is parallel to the first surface. A length k1 of the first surface in the first direction may be greater than a length k2 of the second surface in the first direction. For example, a surface of an end of the second gate 207 which faces the first gate 206 extends in the third direction that crosses the first direction and the second direction. In the middle area I, the surface of the end of the first gate 206 and the surface of the end of the second gate 207 face each other. The surface of the end of the first gate 206 is spaced apart from the surface of the end of the second gate 207 at a predetermined distance g along the first direction.

The first gate 206 and the fourth gate 209 may be disposed symmetrically to each other with respect to a center O of the second contact 260. Therefore, a portion of the fourth gate 209 include a first surface and a second surface in the middle area I. The first surface faces the second gate 207 and the second surface is parallel to the first surface. A length j1 of the first surface in the second direction is smaller than a length j2 of the second surface in the second direction. In addition, the shortest distance g between the first gate 206 and the second gate 207 is substantially equal to a shortest distance g between the third gate 208 and the fourth gate 209.

Referring to FIGS. 7 through 9, the first contact 251 is formed on the first gate 206 to be spaced apart from the first active area 101, and the third contact 255 is formed on the fourth gate 209 to be spaced apart from the second active area 103. The second contact 260 electrically connects the second gate 207 and the third gate 208.

The second contact 260 includes first through third contact parts 261, 265 and 263. The first contact part 261 is formed on the second gate 207 in the middle area I, spaced apart from the first active area 101. The second contact part 265 is formed on the third gate 208 in the middle area I, spaced apart from the second active area 103. The third contact part 263 electrically connects the first contact part 261 and the second contact part 265.

As design rules for fabricating a semiconductor device become finer, patterning becomes more difficult. Therefore, patterning should be performed in such a way to avoid a short circuit by taking into consideration the uniformity of critical dimensions, line-edge roughness (LER) of patterns, and an overlay term for securing a margin to cope with the improper formation of patterns. In the semiconductor device 4, the first contact 251 and the second contact 260 are arranged so that the distance h therebetween is maximized between two adjacent active areas 101 and 103. The second contact 260 and the third contact 255 are arranged so that the distance h therebetween is maximized two adjacent active areas 101 and 103. With such arrangements, the reliability of the semiconductor device 4 may be ensured.

The second contact 260 includes at least one bent portion. For example, the second contact 260 includes the first contact part 261 which is formed on the second gate 207 along the second line L2, the second contact part 265 which is formed on the third gate 208 along the first line L1, and the third contact part 263 which is in contact with the first contact part 261 and the second contact part 265 in a diagonal direction. The third contact part 263 forms an acute angle with each of the first line L1 and the second line L2.

The second contact 260 has a bent shape in a direction away from the center of symmetry O of the second contact 260. A shortest distance between the second contact 260 and the first contact 251 is a distance h between the center of symmetry O of the second contact 260 and the first contact 251. The distance between the second contact 260 and the first contact 251 is maximized due to the bent shape of the second contact 260. A shortest distance between the second contact 260 and the third contact 255 is a distance h between the center of symmetry O of the second contact 260 and the third contact 255. The first contact 251 and the third contact 255 are formed symmetrically to each other with respect to the center of symmetry O of the second contact 260.

Referring to FIG. 8, the first contact 251 is formed on the first gate 206, and the first contact part 261 of the second contact 260 is formed on the second gate 207. The first contact 251 and the second contact 260 are formed in a second interlayer insulating film 240.

A trench T is formed in the second interlayer insulating film 240. A barrier metal 252 is conformally formed on an inner surface of the trench T. For example, the barrier metal 252 is formed, without filling the trench T, to a predetermined thickness on both side surfaces and a lower surface of the trench. Alternatively, the barrier metal 252 may be formed to a predetermined thickness only on the lower surface of the trench. Although not specifically illustrated in the drawing, the barrier metal 252 may be omitted.

The first contact 251 and the second contact 260 may contain different materials. For example, the composition of a material contained in the first contact 251 may be different from that of a material contained in the second contact 260. For example, the first contact 251 and the second contact 260 may be formed by different processes. In the drawing, the barrier metal 252 is not disposed under the second contact 260 (the first contact part 261). However, the present inventive concept is not limited thereto.

Referring to FIG. 9, the second contact 260 includes the first contact part 261, the second contact part 265, and the third contact part 263. The first contact part 261 is formed on the second gate 207, and the second contact part 265 is formed on the third gate 208. The third contact part 263 is formed on a first interlayer insulating film 220 or the second interlayer insulating film 240.

Each of the first through third contact parts 261, 265 and 263 may contain at least one of metal and polysilicon. The first contact part 261 and the second contact part 265 may be made of substantially the same material. For example, the first contact part 261 and the second contact part 265 may be formed in the same process. The third contact part 263 is disposed between the first contact part 261 and the second contact part 265 to electrically connect the first contact part 261 and the second contact part 265. The third contact part 263 may be made of a different material from the first contact part 261 and the second contact part 265. However, the present inventive concept is not limited thereto, and the first through third contact parts 261, 265 and 263 may be formed of the same material as a single part.

Upper surfaces of the first through third contact parts 261, 265 and 263 lie in the same plane. A lower surface of the third contact part 263 is higher than a lower surface of the first contact part 261 or the second contact part 265. For example, the third contact part 263 is in contact with the second interlayer insulting film 240, but the present inventive concept is not limited thereto.

Figure 10:
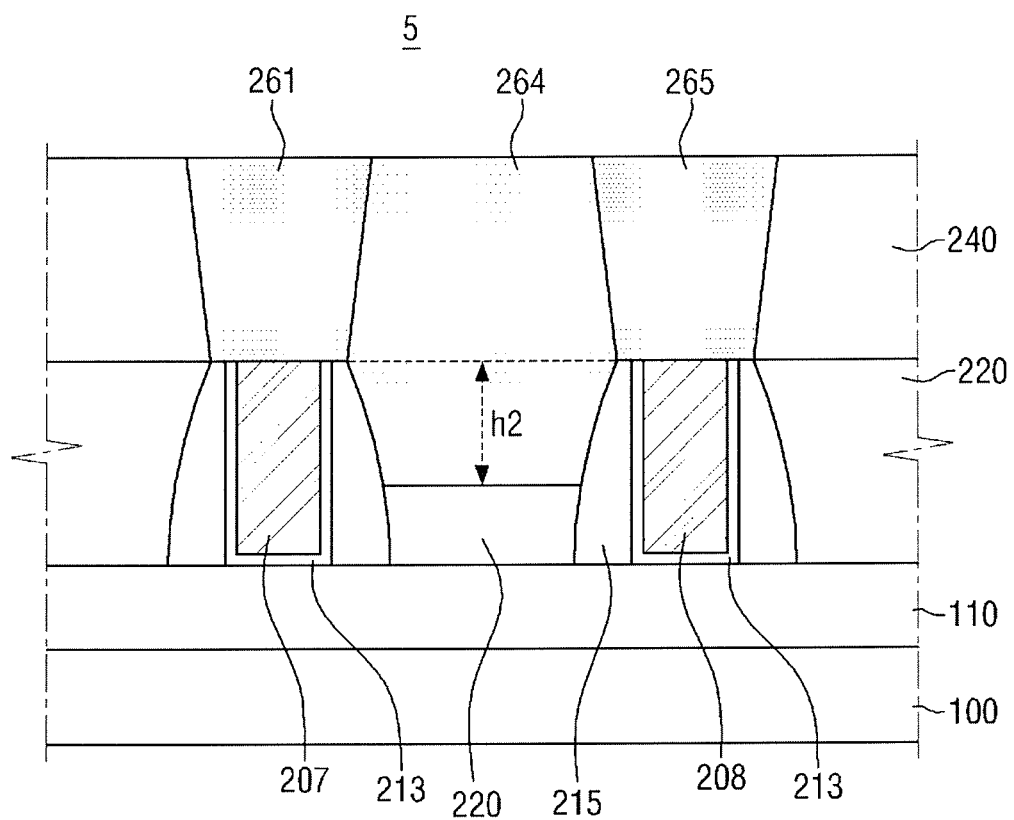
FIG. 10 is a cross-sectional view of a semiconductor device according to an exemplary embodiment of the present inventive concept.

FIG. 10 is a cross-sectional view of a semiconductor device 5 according to an exemplary embodiment of the present inventive concept. For simplicity, a description of elements substantially identical to those of the previous embodiments will be omitted, and the current embodiment will hereinafter be described, focusing mainly on differences with the pervious embodiments.

Referring to FIG. 10, the semiconductor device 5 may be substantially the same as the semiconductor device 4 of FIG. 7.

A second contact 260 of the semiconductor device 5 includes a first contact part 261, a second contact part 265, and a third contact part 264. For example, the first contact part 261 is formed on a second gate 207, and the second contact part 265 is formed on a third gate 208. The third contact part 264 is formed on a first interlayer insulating film 220.

Upper surfaces of the first through third contact parts 261, 265 and 264 lie in the same plane. A lower surface of the third contact part 264 is lower than a low surface of the first contact part 261 or the second contact part 265. In addition, the lower surface of the third contact part 264 is lower than an upper surface of the second gate 207 or the third gate 208. Therefore, the third contact part 264 is in contact with a spacer 215 formed on a side surface of the second gate 207 or the third gate 208. In addition, the third contact part 264 is in contact with a first interlayer insulating film 220. However, the present inventive concept is not limited thereto.

Figure 11:
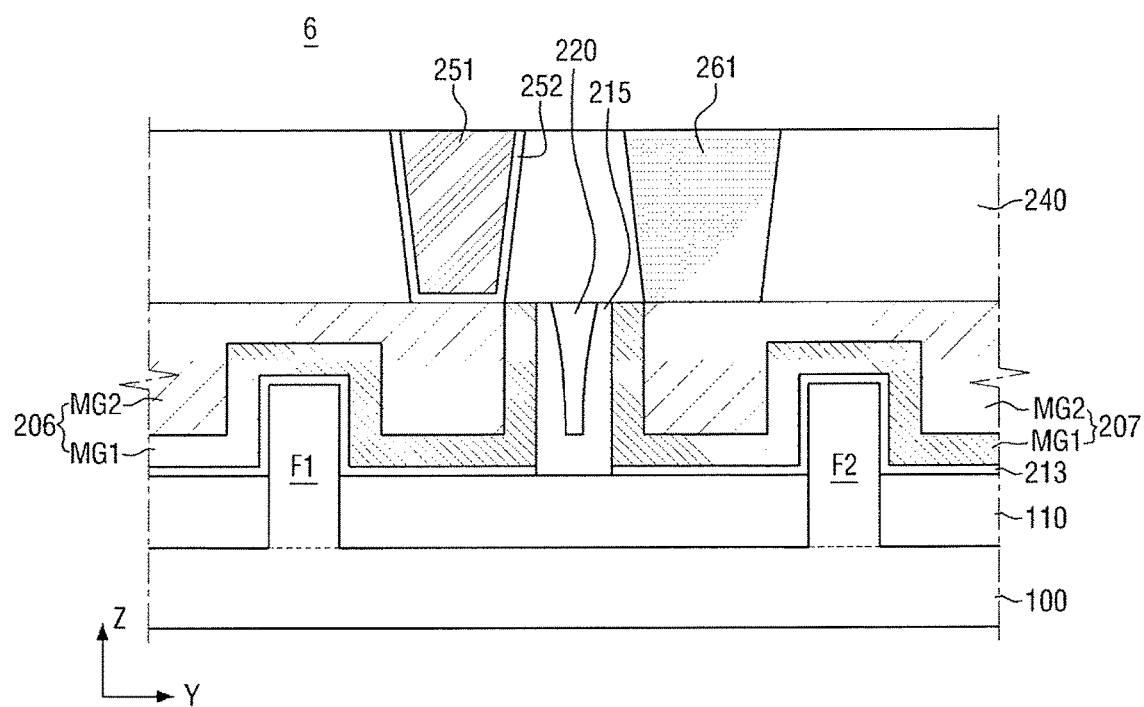
FIG. 11 is a cross-sectional view of a semiconductor device according to an exemplary embodiment of the present inventive concept.

FIG. 11 is a cross-sectional view of a semiconductor device 6 according to an exemplary embodiment of the present inventive concept.

Referring to FIG. 11, the semiconductor device 6 may be substantially the same as the semiconductor device 4 described above with reference to FIGS. 7 through 9. For simplicity, a description of elements substantially identical to those of the previous embodiments will be omitted, and the current embodiment will hereinafter be described, focusing mainly on differences with the pervious embodiments.

Each of first through fourth gates 206 through 209 of the semiconductor device 6 may include metal layers (MG1, MG2). As illustrated in the drawing, each of the first through fourth gates 206 through 209 may be formed by stacking two or more metal layers (MG1, MG2) on each other. A first metal layer MG1 may serve to control a work function, and a second metal layer MG2 may fill a space formed by the first metal layer MG1. For example, the first metal layer MG1 may contain at least one of TiN, TaN, TiC, and TaC. In addition, the second metal layer MG2 may contain W or Al. Alternatively, each of the first through fourth gates 206 through 209 may be made of a material (e.g., Si or SiGe) other than a metal.

Although not specifically illustrated in the drawing, elevated source or drain regions (not illustrated) may be formed on both sides of each of the first through fourth gates 206 through 209 and on each of a first fin F1 and a second fin F2. The elevated source or drain regions (not illustrated) may be in contact with side surfaces of a spacer 215 and the first and second fins F1 and F2.

Each of the elevated source or drain regions (not illustrated) may have various shapes. For example, each of the elevated source or drain regions (not illustrated) may have at least one of a diamond shape, a circular shape, and a rectangular shape.

Figure 12A:
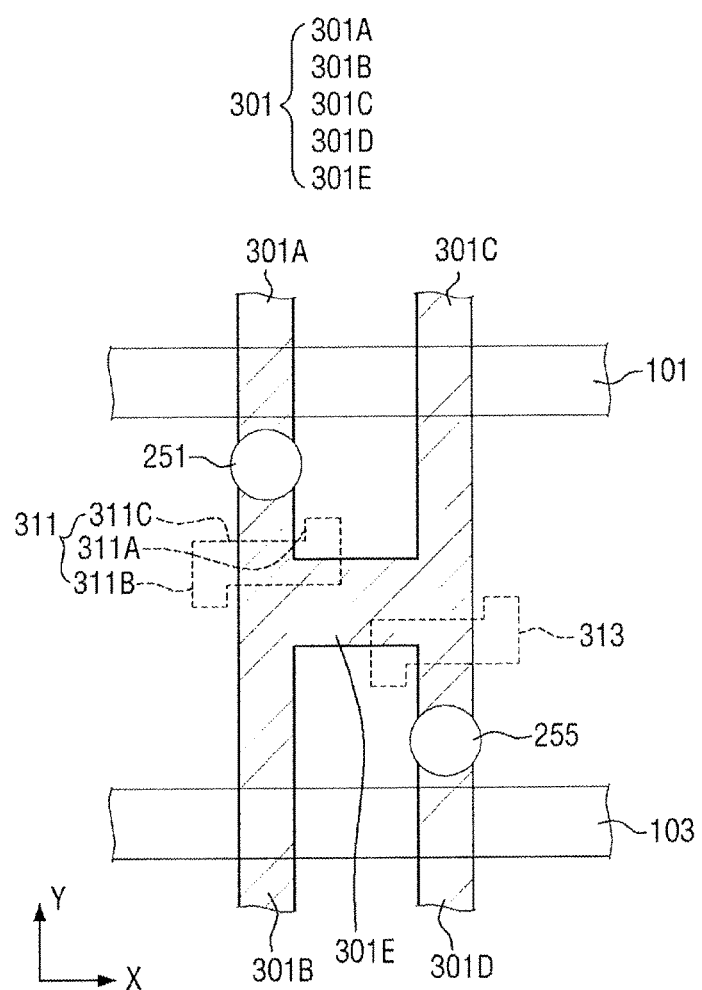
FIGS. 12A and 12B are views illustrating a method of fabricating a semiconductor device according to an exemplary embodiment of the present inventive concept.
Figure 12B:
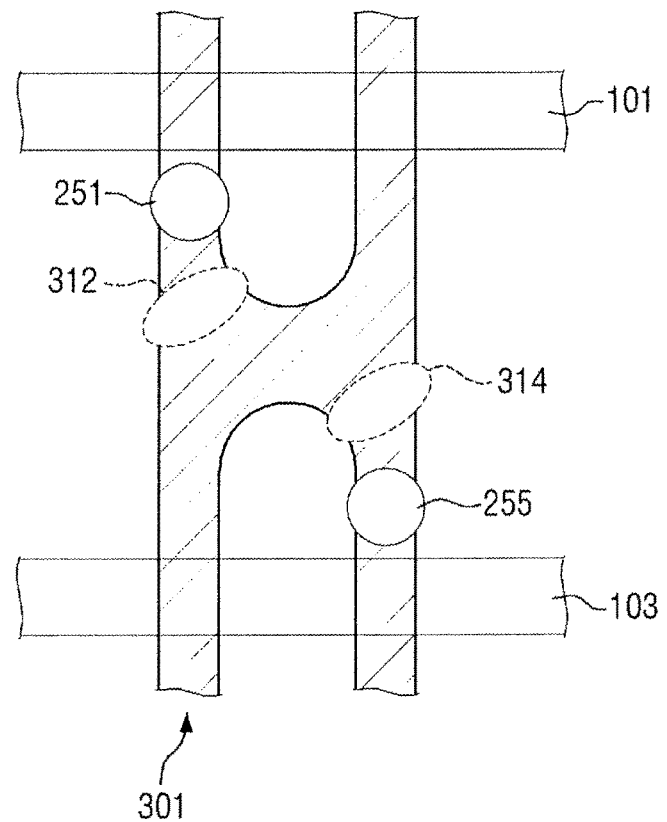

FIGS. 12A and 12B are views illustrating a method of fabricating a semiconductor device according to an exemplary embodiment of the present inventive concept.

Referring to FIG. 12A, a first active area 101 and a second active area 103 spaced apart from the first active area 101 are formed.

Then, an H-shaped gate 301 is formed. The H-shaped gate 301 includes first through fifth gate parts 301A through 301E.

The first gate part 301A partially overlaps the first active area 101, extending along a first direction. The second gate part 301B, extending along the first direction, partially overlaps the second active area 103. The third gate part 301C partially overlaps the first active area 101, extending along a second direction. The fourth gate part 301D, extending along the second direction, partially overlaps the second active area 103. The fifth gate part 301E connects the first through fourth gate parts 301A through 301D and is disposed in a middle area I between the first and second active areas 101 and 103.

Referring to FIG. 12B, the H-shaped gate 301 is partially etched. The partially etching of the H-shaped gate 301 may include performing a selective lithography process on the H-shaped gate 301 using a mask and patterning the gate 301 by etching exposed portions.

For example, the gate 301 of FIG. 12A is partially etched such that the first gate part 301A and the second gate part 301B are separated from each other, that the third gate part 301C and the fourth gate part 301D are separated from each other, and that the fifth gate part 301E connects the second gate part 301B and the third gate part 301C. Here, a portion of the second gate part 301B or the third gate part 301C which overlaps the middle area I may be shaped like a right-angled trapezoid.

The mask used in the etching process includes first and second sub-mask patterns 311 and 313. The first and second sub-mask patterns 311 and 313 may be staircase patterns, right-angled patterns, or diagonal patterns.

For example, the first sub-mask pattern 311 includes a first etch part 311A which extends along a first direction, a second etch part 311B which extends along the first direction. The third etch part 311C which connects the first etch part 311A and the second etch part 311B extends along a second direction. The second direction may form a right angle with the first direction. The second sub-mask pattern 313 may have substantially the same configuration with the first sub-mask pattern 3111. The present inventive concept is not limited thereto, and the second sub-mask pattern 313 may have a different shape from the first sub-mask pattern 311. For example, each of the first and second sub-mask patterns 311 and 313 may be a staircase pattern or a right-angled pattern. The first sub-mask pattern 311 is disposed between the first gate part 301A and the second gate part 301B, and the second sub-mask pattern 313 is disposed between the third gate part 301C and the fourth gate part 301D.

In an exposure process, the first and second sub-mask patterns 311 and 313 may be used to etch the H-shaped gate 301 in a diagonal shape. As a result, first through third gates 203, 201 and 205 described above with reference to FIG. 1 may be formed.

Figure 13:
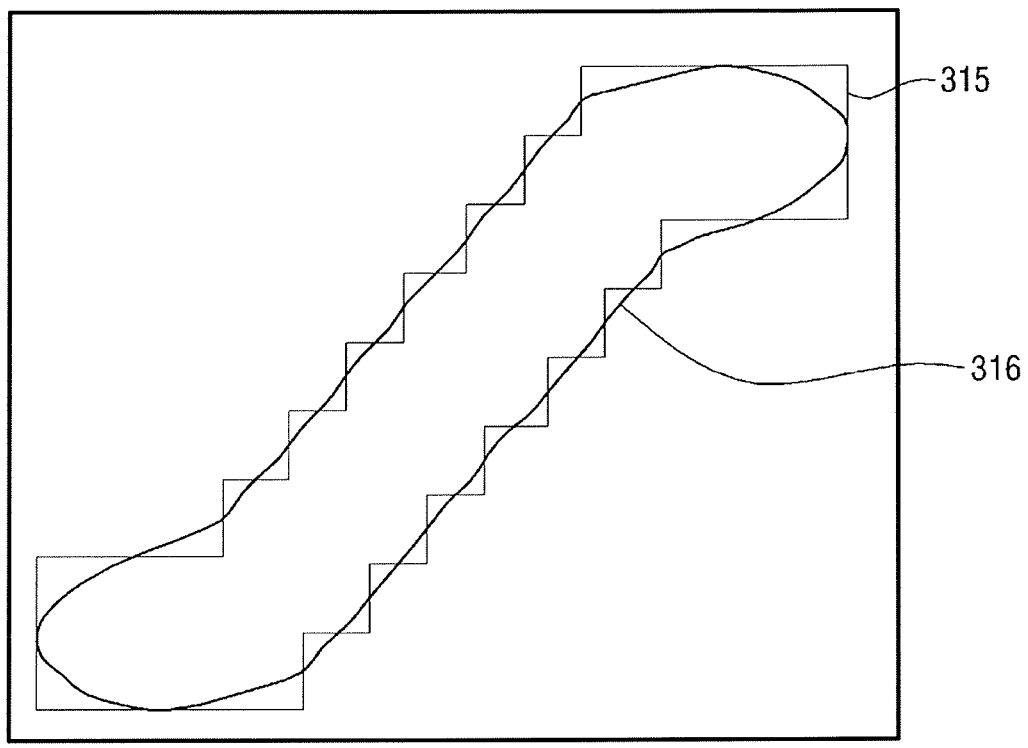
FIG. 13 is a layout view of a mask having a staircase pattern used in a method of fabricating a semiconductor device according to an exemplary embodiment of the present inventive concept.

FIG. 13 is a layout view of a staircase pattern according to an exemplary embodiment of the present inventive concept.

Referring to FIG. 13, a sub-mask pattern 315 has side edge having a staircase pattern. However, the inventive concept is not limited thereto, and the sub-mask pattern 315 may have patterns other than the staircase pattern. For example, the sub-mask pattern 315 may be a non-staircase pattern. When the sub-mask pattern 315 is a staircase pattern, a gate is highly likely to be patterned in a diagonal shape 316 in a patterning process.

Figure 14:
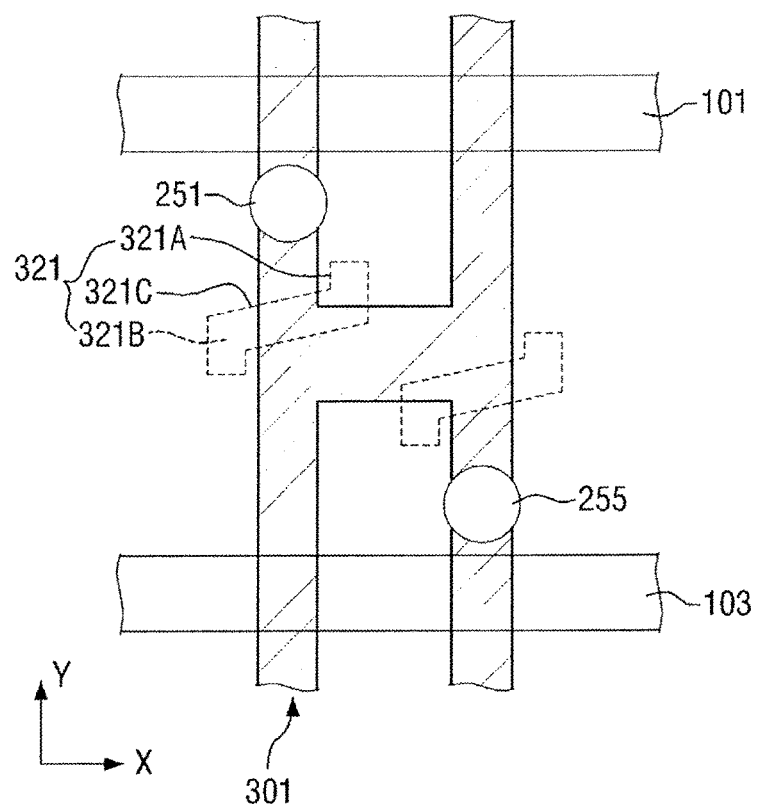
FIGS. 14 through 16 are views illustrating a method of fabricating a semiconductor device according to an exemplary embodiment of the present inventive concept.
Figure 15:
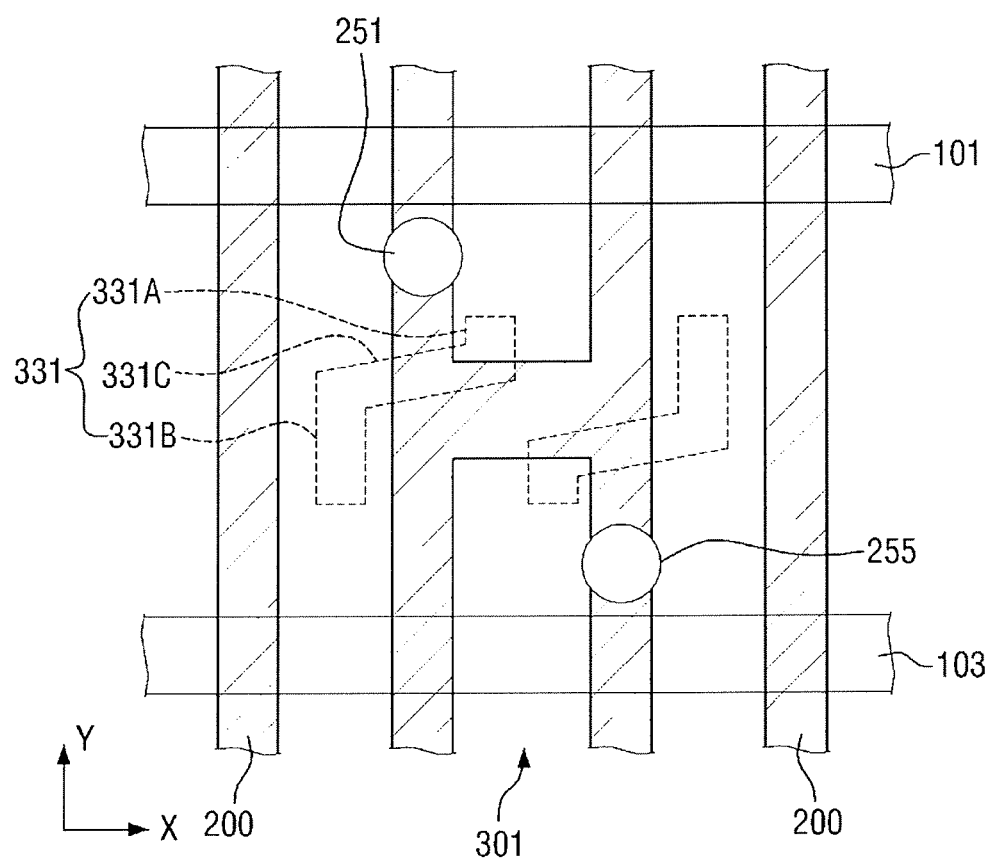
Figure 16:
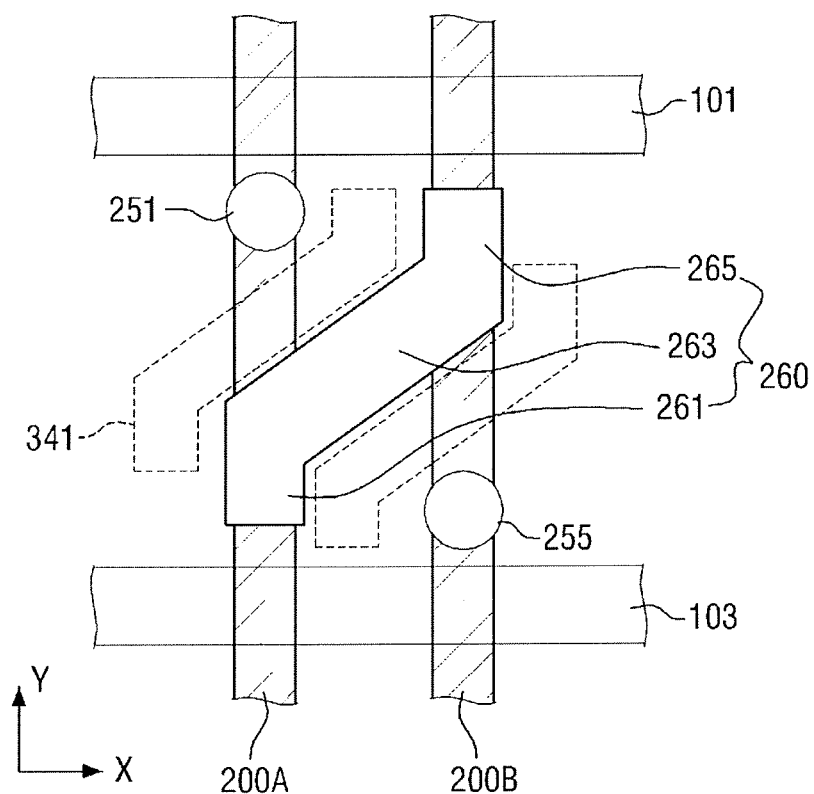

FIGS. 14 through 16 are views illustrating steps of methods of fabricating a semiconductor device according to embodiments of the present inventive concept.

Referring to FIG. 14, a sub-mask pattern 321 includes a first etch part 321A which extends in a first direction, a second etch part 321B which extends in a second direction to be separated from the first etch part 311A, and a third etch part 321C which connects the first etch part 321A and the second etch part 321B and extends in a third direction. The third direction may form an acute angle with each of the first direction and the second direction. For example, the sub-mask pattern 321 may be a diagonal pattern. A length of the first etch part 321A or the second etch part 312B can be increased as desired. The third etch part 321C may extend in a diagonal direction, and an angle of a gate pattern formed may vary according to an angle of the third etch part 321C.

The sub-mask pattern 321 may be used in an exposure process to etch an H-shaped gate 301 in a diagonal shape. As a result, first through third gates described above with reference to FIG. 1 may be formed.

Referring to FIGS. 15 and 16, sub-mask patterns 331 and 341 may be substantially identical to the sub-mask pattern 321 of FIG. 14, except that the sub-mask patterns 331 and 341 include a first etch part and a second etch part which are different from each other in length.

Figure 17:
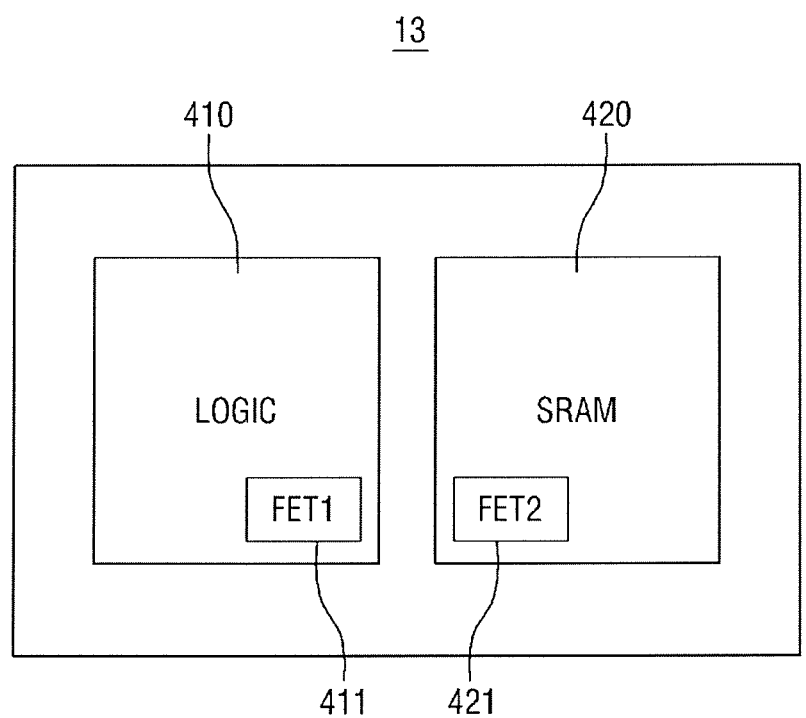
FIG. 17 is a block diagram of a semiconductor device according to an exemplary embodiment of the present inventive concept.
Figure 18:
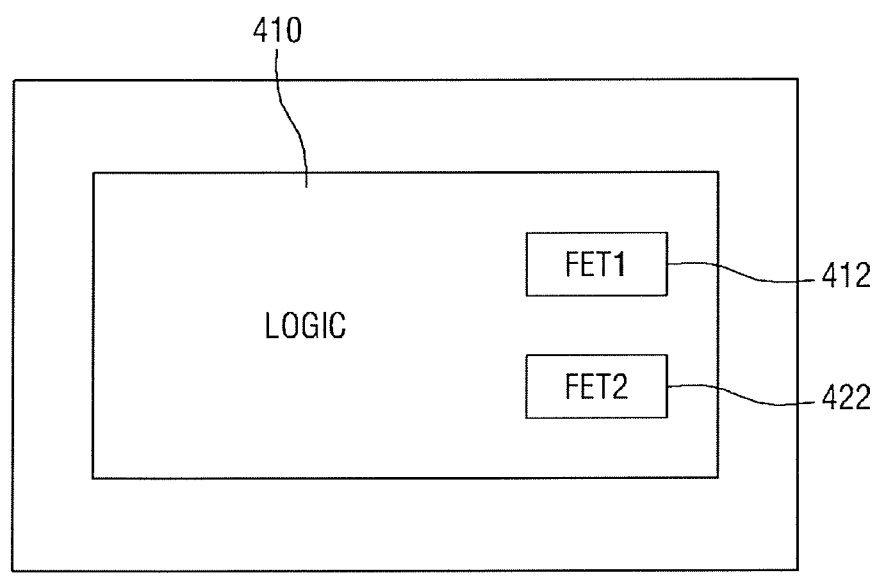
FIG. 18 is a block diagram of a semiconductor device according to an exemplary embodiment of the present inventive concept.

FIG. 17 is a block diagram of a semiconductor device 13 according to an exemplary embodiment of the present inventive concept. FIG. 18 is a block diagram of a semiconductor device 14 according to an exemplary embodiment of the present inventive concept. For simplicity, a description of elements substantially identical to those of the previous embodiments will be omitted, and the current embodiments will hereinafter be described, focusing mainly on differences with the pervious embodiments.

Referring to FIG. 17, the semiconductor device 13 includes a logic region 410 and a static random access memory (SRAM) region 420. An eleventh transistor 411 is disposed in the logic region 410, and a twelfth transistor 421 is disposed in the SRAM region 420.

The eleventh transistor 411 and the twelfth transistor 421 are semiconductor transistors according to an exemplary embodiment. The eleventh transistor 411 may have a different conductivity type from the twelfth transistor 421. Alternatively, the eleventh transistor 411 and the twelfth transistor 421 may have the same conductivity type. The semiconductor device 13 may include a semiconductor device according to an exemplary embodiment of the present inventive concept.

Referring to FIG. 18, the semiconductor device 14 includes a logic region 410. Thirteenth and fourteenth transistors 412 and 422 different from each other are disposed in the logic region 410. Although not specifically illustrated in the drawing, the thirteenth and fourteenth transistors 412 and 422 different from each other may also be disposed in an SRAM region.

In some embodiments of the present inventive concept, the thirteenth transistor 412 and the fourteenth transistor 422 may have different conductivity types. Alternatively, the thirteenth transistor 412 and the fourteenth transistor 422 may have the same conductivity type. The semiconductor device 14 may include a semiconductor device according to an exemplary embodiment of the present inventive concept.

The present inventive concept is not limited thereto. For example, the present inventive concept is applicable to a region where a memory (e.g., DRAM, MRAM, RRAM, PRAM, etc.) is formed.

Figure 19:
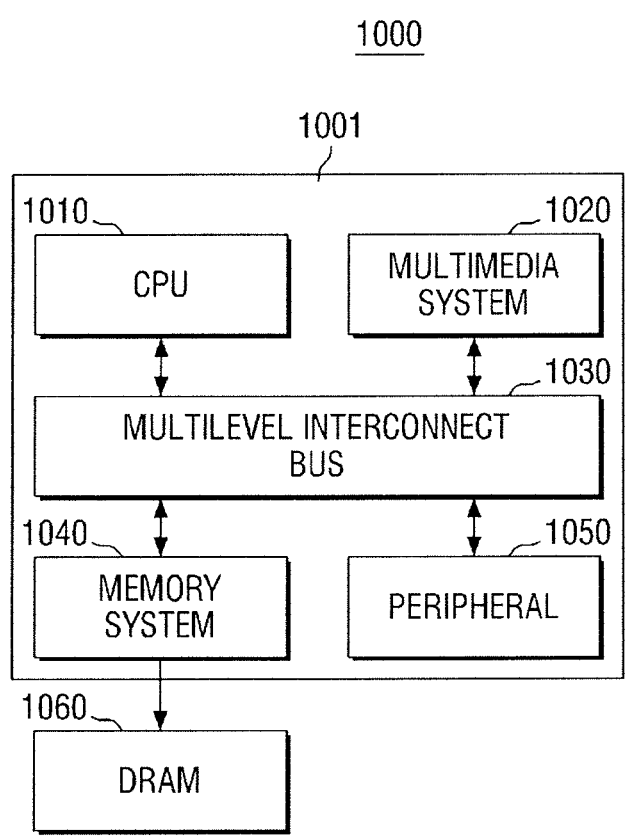
FIG. 19 is a block diagram of a system-on-chip (SoC) system including a semiconductor device according to an exemplary embodiment of the present inventive concept.

FIG. 19 is a block diagram of a system-on-chip (SoC) system 1000 including a semiconductor device according to an exemplary embodiment of the present inventive concept.

Referring to FIG. 19, the SoC system 1000 includes an application processor 1001 and a dynamic random access memory (DRAM) 1060.

The application processor 1001 includes a central processing unit (CPU) 1010, a multimedia system 1020, a bus 1030, a memory system 1040, and a peripheral circuit 1050.

The CPU 1010 may perform operations needed to drive the SoC system 1000. In some embodiments of the present inventive concept, the CPU 1010 may be configured as a multi-core environment including a plurality of cores.

The multimedia system 1020 may be used to perform various multimedia functions in the SoC system 1000. The multimedia system 1020 may include a three dimensional (3D) engine module, a video codec, a display system, a camera system, and a post-processor.

The bus 1030 may be used for data communication among the CPU 1010, the multimedia system 1020, the memory system 1040 and the peripheral circuit 1050. In some exemplary embodiments of the present inventive concept, the bus 1030 may have a multilayer structure. For example, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some exemplary embodiments, the memory system 1040 may include a controller (e.g., a DRAM controller) for controlling the external memory (e.g., the DRAM 1060).

The peripheral circuit 1050 may provide an environment needed for the SoC system 1000 to be connected to an external device (e.g., mainboard). Accordingly, the peripheral circuit 1050 may include various interfaces that enable the external device to be connected to the SoC system 1000.

The DRAM 1060 may function as an operating memory needed for the operation of the application processor 1001. In some embodiments, the DRAM 1060 may be placed outside the application processor 1001 as illustrated in the drawing. For example, the DRAM 1060 may be packaged with the application processor 1001 in the form of package on package (PoP).

At least one of the elements of the SoC system 1000 may employ a semiconductor device according to an exemplary embodiment of the present inventive concept.

Figure 20:
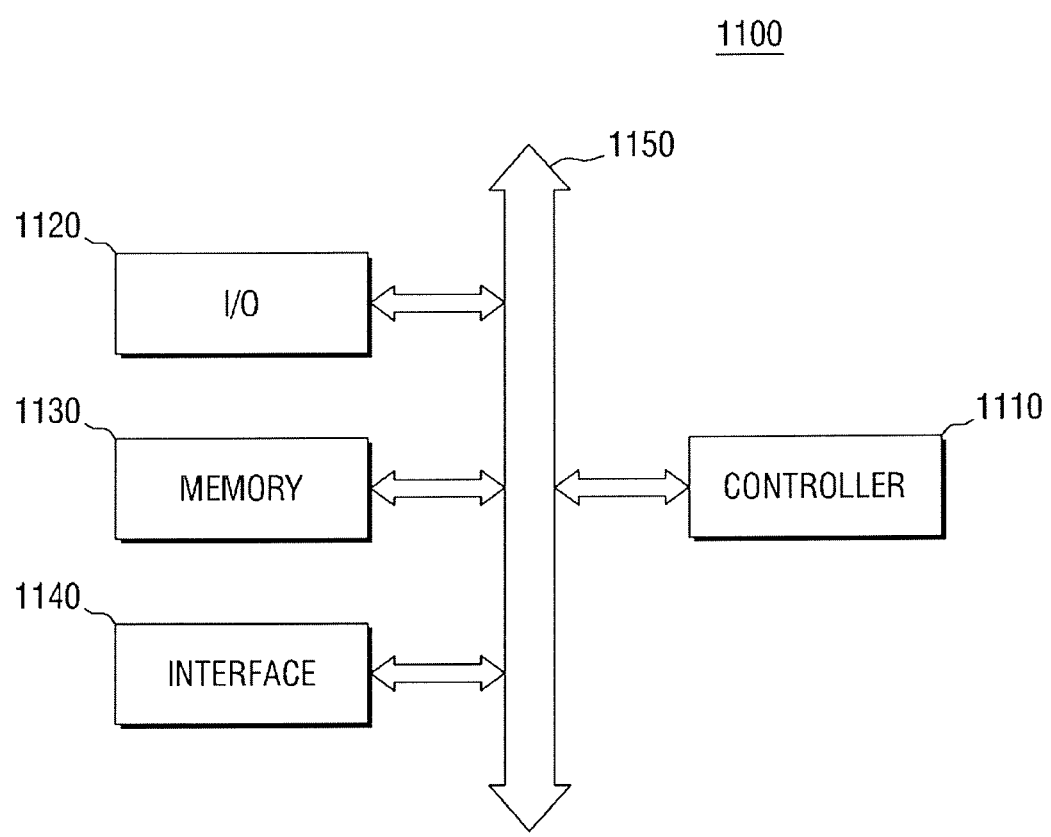
FIG. 20 is a block diagram of an electronic system including a semiconductor device according to an exemplary embodiment of the present inventive concept.

FIG. 20 is a block diagram of an electronic system 1100 including a semiconductor device according to an exemplary embodiment of the present inventive concept.

Referring to FIG. 20, the electronic system 1100 includes a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an exemplary embodiment, the interface 1140 may include an antenna or a wired or wireless transceiver.

Although not illustrated in the drawing, the electronic system 1100 may further include a high-speed DRAM or SRAM to increase the performance of the controller 1110. For example, a semiconductor device according to an exemplary embodiment of the present inventive concept may be employed as the working memory. In addition, a semiconductor device according to an exemplary embodiment of the present inventive concept may be provided in the memory device 1130 or in the controller 1110 or the I/O device 1120.

The electronic system 1100 may be applied to electronic products capable of transmitting and/or receiving information in a wireless environment, such as a personal data assistant (PDA), a portable computer, a web tablet, a wireless phone, a mobile phone, a digital music player, a memory card, etc.

Figure 21:
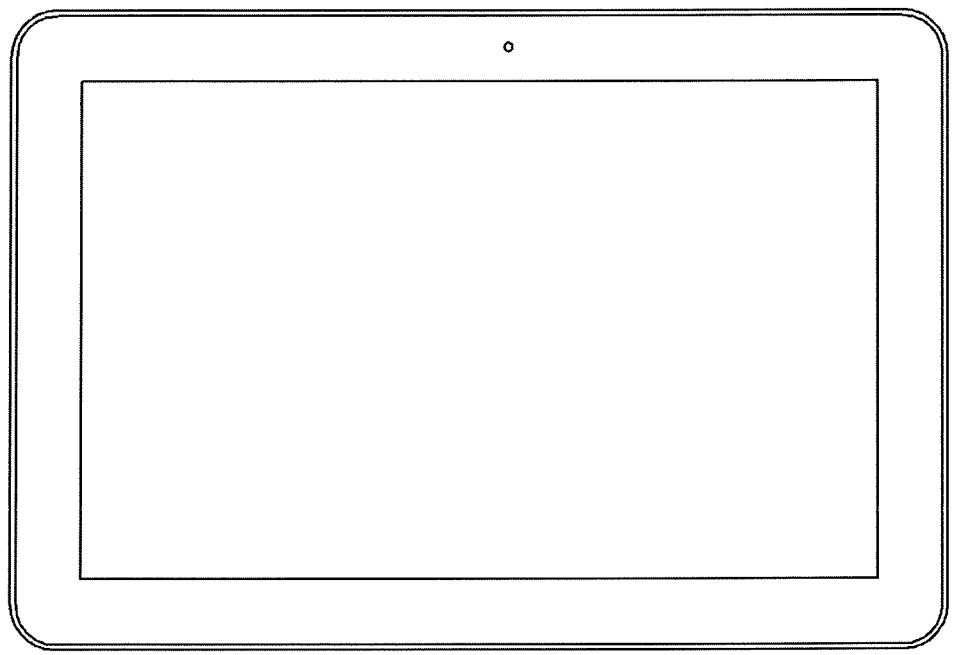
FIGS. 21 through 23 are diagrams illustrating a semiconductor system including a semiconductor device according to an exemplary embodiment of the present inventive concept.
Figure 22:
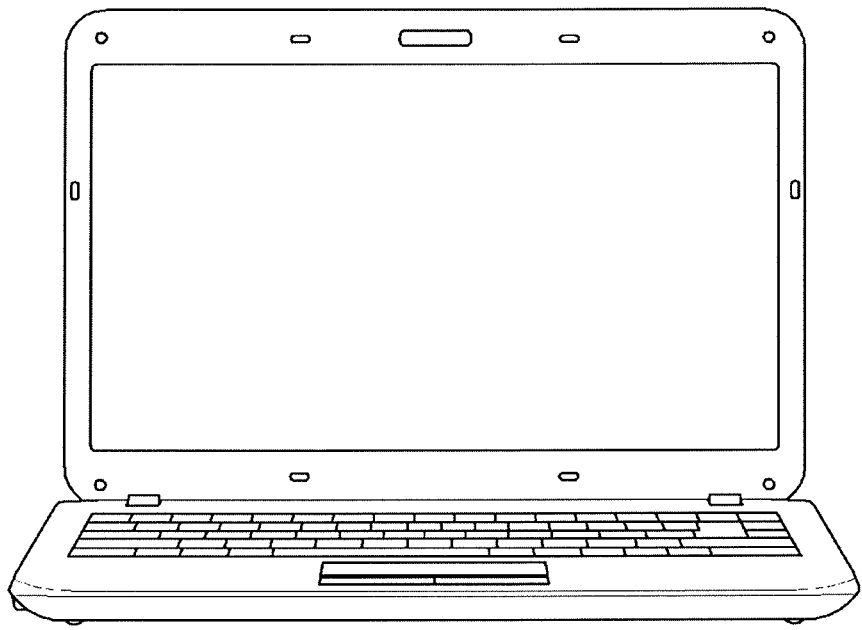
Figure 23:
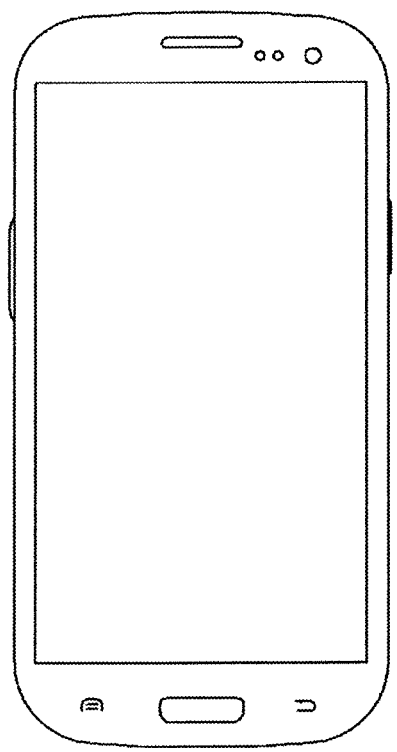

FIGS. 21 through 23 are diagrams illustrating semiconductor systems including a semiconductor device according to an exemplary embodiment of the present inventive concept.

FIG. 21 illustrates a tablet personal computer (PC) 1200, FIG. 22 illustrates a notebook computer 1300, and FIG. 23 illustrates a smartphone 1400. A semiconductor device according to an exemplary embodiment of the present inventive concept may be used in the tablet PC 1200, the notebook computer 1300, and the smartphone 1400.

A semiconductor device according to an exemplary embodiment may be applied to various IC devices other than those set forth herein. For example, an exemplary semiconductor system are not limited to the tablet PC 1200, the notebook computer 1300, and the smartphone 1400. In some embodiments of the present inventive concept, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   a first active area;
   a second active area which is spaced apart from the first active area; and
   a first gate line comprising:
      a first gate part crossing the first active area along a first imaginary line,
      a second gate part crossing the second active area along a second imaginary line, wherein the first imaginary line is spaced apart from the second imaginary line in a direction perpendicular to an extending direction of the first and second gate parts, and
      a third gate part connecting the first gate part and the second gate part and extending along a third imaginary line crossing the first imaginary line and the second imaginary line,
      wherein the first gate part, the second gate part and the third gate part are each parts of a single integrally formed structure, and
      wherein the first gate part, the second gate part and the third gate part are arranged so that the first gate line has a shape of 180° rotational symmetry and a point of the 180° rotational symmetry is located on the third gate part.

2. The semiconductor device of claim 1, further comprising:
   a second gate line crossing the first active area along the second imaginary line; and
   a third gate line crossing the second active area along the first imaginary line,
   wherein the second gate line and the third gate line are spaced apart from the first gate line.

3. The semiconductor device of claim 2,
   wherein the second gate line includes, at an end portion thereof, an end surface facing the third gate part, and
   wherein the end surface extends in a direction substantially parallel to an extending direction of the third imaginary line.

4. The semiconductor device of claim 3,
   wherein the second gate line comprises a first surface facing the first gate part and a second surface which is substantially parallel to the first surface and opposite to the first surface,
   wherein the first and second surfaces do not overlap the first active area,
   wherein the first and second surfaces are connected to the end surface,
   wherein a length of the first surface is substantially equal to a length of the second surface, and
   wherein the length of the first surface and the length of the second surface are measured in a direction substantially parallel to an extending direction of the first surface.

5. The semiconductor device of claim 2, further comprising:
   a first contact disposed on the second gate line; and
   a second contact disposed on the third gate line,
   wherein the first contact and the second contact are disposed between the first active area and the second active area,
   wherein the first contact is positioned opposite to the second contact with respect to the point of the 180° rotational symmetry.

6. The semiconductor device of claim 1,
   wherein a first width of the first gate part is smaller than a second width of the third gate part,
   wherein the first width is measured in a direction substantially parallel to an extending direction of the second active area, and
   the second width is measured in a direction substantially perpendicular to the third imaginary line.

7. The semiconductor device of claim 1,
wherein the first active area comprises a first fin protruding upward from a substrate, and the second active area comprises a second fin formed parallel to the first fin.

8. A semiconductor device comprising:
a first active area extending along a first direction;
a second active area which is spaced apart from the first active area;
a middle area disposed between the first and second active areas;
a first gate line comprising a first gate part crossing the first active area along a first imaginary line extending in a second direction intersecting the first direction, a second gate part crossing the second active area along a second imaginary line extending in the second direction, and a third gate part connecting the first gate part and the second gate part in the middle area;
a second gate line crossing the first active area along the second imaginary line, wherein a first end portion of the second gate line is disposed in the middle area; and
a third gate line crossing the second active area along the first imaginary line, wherein a second end portion of the third gate line is disposed in the middle area,
wherein the first and second end portions each have a shape of a right-angled trapezoid,
wherein the second gate line and the third gate line are spaced apart from the first gate line,
wherein the first end portion of the second gate line comprises a first surface and a second surface in the middle area,
wherein the first surface faces the first gate part and the second surface is parallel to the first surface and opposite to the first surface, and
wherein a length of the first surface in the second direction is smaller than a length of the second surface in the second direction.

9. The semiconductor device of claim 8,
wherein the first end portion of the second gate line includes a first end surface facing the third gate part,
wherein the first end surface connects the first and second surfaces, and
wherein the second end portion of the third gate line includes a second end surface which is substantially parallel to the first end surface.

10. The semiconductor device of claim 8,
wherein the first gate part, the second gate part and the third gate part are positioned in a same plane.

11. The semiconductor device of claim 8,
wherein a first length between the second gate line and the first gate line measured in along the first imaginary line is greater than a shortest distance between the second gate line and the third gate part.

12. The semiconductor device of claim 8,
wherein the second gate line and the third gate line are arranged in 180° rotational symmetry with respect to a point of the 180° rotational symmetry,
wherein the point of the 180° rotational symmetry is located on the third gate part.

13. A semiconductor device comprising:
a first active area;
a second active area spaced apart from the first active area;
a middle area disposed between the first and second active areas;
a first gate line crossing the first active area along a first imaginary line, wherein a first end portion of the first gate line is disposed in the middle area;
a second gate line crossing the second active area along the first imaginary line, wherein a second end portion of the second gate line is disposed in the middle area;
a third gate line crossing the first active area along a second imaginary line, wherein a third end portion of the third gate line is disposed in the middle area;
a fourth gate line crossing the second active area along the second imaginary line, wherein a fourth end portion of the fourth gate line is disposed in the middle area;
a first contact part disposed on the second gate line in the middle area;
a second contact part disposed on the third gate line in the middle area; and
a third contact part connecting the first contact part and the second contact part,
wherein the first to fourth end portions have a shape of a right-angled trapezoid.

14. The semiconductor device of claim 13, wherein the first end portion of the first gate line comprises a first surface facing the third gate line in the middle area and a second surface which is parallel to the first surface and opposite to the first surface, wherein a length of the first surface in an extending direction of the first imaginary line is smaller than a length of the second surface in the extending direction.

15. The semiconductor device of claim 13,
wherein an upper surface of the first contact part, an upper surface of the second contact part and an upper surface of the third contact part are positioned at a substantially same height, and the third contact part extends in a third imaginary line intersecting the first imaginary line and the second imaginary line.

16. The semiconductor device of claim 13,
wherein a lower surface of the third contact part is higher than a lower surface of the first or second contact part.

17. The semiconductor device of claim 13,
wherein a lower surface of the third contact part is lower than an upper surface of the second gate line or an upper surface of the third gate line.

18. The semiconductor device of claim 13, wherein the third contact part is formed on an interlayer insulating film between the second and third gate lines.

19. The semiconductor device of claim 13, further comprising:
a spacer which is formed on a side surface of the first gate line, a side surface of the second gate line, a side surface of the third gate line and a side surface of the fourth gate line,
wherein the third contact part is in contact with the spacer formed on the side surface of the second gate line or the side surface of the third gate line.

* * * * *